United States Patent [19]

Ando et al.

[11] Patent Number: 5,386,528

[45] Date of Patent: Jan. 31, 1995

[54] ADDRESS TRANSLATOR HAVING A HIGH SPEED DATA COMPARATOR

[75] Inventors: Hideki Ando; Hirohisa Machida, both of Hyogo, Japan

[73] Assignee: Mitsubishi Denki Kabushiki Kaisha, Tokyo, Japan

[21] Appl. No.: 874,921

[22] Filed: Apr. 29, 1992

Related U.S. Application Data

[62] Division of Ser. No. 643,987, Jan. 22, 1991, Pat. No. 5,130,692.

[30] Foreign Application Priority Data

Jan. 24, 1990 [JP] Japan .................. 2-15385

[51] Int. Cl.$^6$ .................. G06F 12/10; G11C 15/00
[52] U.S. Cl. .................. 395/400; 365/49; 340/146.2
[58] Field of Search .................. 340/146.2; 365/49; 395/400

[56] References Cited

U.S. PATENT DOCUMENTS

| | | | |
|---|---|---|---|
| 4,225,849 | 9/1980 | Lai | 340/146.2 |
| 4,813,002 | 3/1989 | Joyce et al. | 365/49 |
| 4,852,059 | 7/1989 | Oates | 365/49 |
| 4,910,668 | 3/1990 | Okamoto et al. | 395/400 |
| 4,928,260 | 5/1990 | Chuang et al. | 365/49 |
| 4,959,811 | 9/1990 | Szczepanek | 365/49 |
| 4,970,643 | 11/1990 | Cramm | 395/400 |
| 5,053,991 | 10/1991 | Burrows | 365/49 |
| 5,067,078 | 11/1991 | Talgam et al. | 395/400 |
| 5,072,422 | 12/1991 | Rachels | 365/49 |
| 5,109,496 | 4/1992 | Beausoleil et al. | 395/400 |

FOREIGN PATENT DOCUMENTS 62-118434 5/1987 Japan.

OTHER PUBLICATIONS

"A 32-Bit CMOS Microprocessor with On-Chip Cache and TLB", Kadota et al., IEEE Journal of Solid-State State Circuits, vol. SC, No. 5, pp. 800–807. Introduction to VLSI Systems, pp. 26–29.

Primary Examiner—Joseph L. Dixon
Assistant Examiner—Jack A. Lane
Attorney, Agent, or Firm—Lowe, Price, LeBlanc & Becker

[57] ABSTRACT

An address translator has an improved data comparison circuit for comparing two pieces of data having n bits, e.g., 12 bits. In the data comparison circuit, cell circuits compare two pieces of data for every corresponding 4 bits. When a match is detected in the comparison of a set of 4 bits, a signal representative of the comparison result of the lower-order bits is bypassed. Hence, delay of signal propagation which may occur in the cell circuit in which the match is detected is reduced.

2 Claims, 15 Drawing Sheets

ADDRESS TRANSLATOR HAVING A HIGH SPEED DATA COMPARATOR

This application is a division of allowed application Ser. No. 07/643,987 filed Jan. 22, 1991, now U.S. Pat. No. 5,130,692 issued Jul. 14, 1992.

FIELD OF THE INVENTION

The present invention relates generally to data comparators, and particularly to a data comparator for comparing, at higher speed, two pieces of data each having a plurality of bits at higher speed. The invention has particular applicability to a translation lookaside buffer (TLB) for translating an applied logical address into a physical address in a computer system.

DESCRIPTION OF THE BACKGROUND ART

Generally, comparison between two pieces of data is frequently performed in operations utilizing a computer. For example, sorting, in which a large number of data are rearranged, has been conventionally conducted by software. On the other hand, a circuit is known, which makes use of hardware at high speed two pieces of data.

FIG. 17 is a circuit diagram of a cell circuit 10 shown in Patent Laying-Open 62-118434 which is capable of storing and comparing 1 bit data. The cell circuit 10 comprises an SRAM section 50, transistors 56, 71, and 72 and a NAND gate 73. Data D, $\overline{D}$ are applied through a bit line pair BL, $\overline{BL}$ and comparison is made between data M, $\overline{M}$ stored in the SRAM section 50 and the applied data D, $\overline{D}$. If the two data match, the NAND gate 73 generates a high level signal. This results in turning on the transistor 56. On the other hand, if the relation of the two pieces of data is M<D, the transistors 71 and 72 are turned on thereby causing a comparison line CML to attain a low level. On the contrary, if the relation of the two data follows M>D, the potential of the comparison line CML remains the same.

In order to compare two pieces of data each including a plurality of bits, it is necessary to connect a plurality of cell circuits 10 through the comparison line CML as shown in FIG. 18. A transistor $T_7$ and an inverter INV are provided to transmit the comparison result quickly. This is because the transistor 56 for transmission in the cell circuit 10 is a passive device and the transmission of the comparison result is therefore delayed.

When a plurality of the cell circuits 10 are connected through the comparison line CML, the transistors 56 for transmitting comparison results are connected in series as shown in FIG. 19A. The equivalent circuit is shown in FIG. 19A. The series connection of the transistors 56 constitutes a delay circuit formed of resistance component R and capacitance component C shown in FIG. 19B. This means that a signal representative of a comparison result is inevitably delayed in the circuit connection indicated in FIG. 18. The signal indicating a comparison result is delayed most when the comparison result of two pieces of data is determined depending upon the comparison result at the least significant bit (LSB). That is, in this case, the signal representative of the comparison result in the cell circuit 10 which forms the LSB is transmitted toward the cell circuit of the most significant bit (MSB) through the comparison line CML. This results in a long period of time until the comparison result of the two pieces of data is generated.

It is pointed out that a conventional comparison circuit shown in FIG. 18 has a low operating speed.

The Translation Lookaside Buffer (referred to as "TLB" hereinafter), to which the present invention may be applied, will be described below. Generally, in addressing a memory in a computer system, translation is conducted from a logical address (or a virtual address) into a physical address. In the translation, it is usually required to refer to a segment map table or a page map table etc. on the main memory. This means that it is necessary to make an access to the main memory at least three times in order that one instruction is executed by the computer. To increase the processing speed by the computer, it is necessary to reduce the number of the accesses. The TLB is known as a register capable of translating a logical address into a physical address without referring to the map table on the main memory. An example of a microprocessor provided with the TLB is found, for instance, in an article under the title of "A 32-bit CMOS Microprocessor with On-chip Cache and TLB" (IEEE Journal of Solid-State Circuits VOL. SC-22, NO. 5, October, 1987). While several kinds of TLB have been conventionally known, a TLB for the full associative method, to which the present invention is applicable, will be described below. Now, in the following, a logical space of 4 giga bytes which can be designated by an address signal of 32 bits is assumed. In the logical space, data of 512 bytes which can be designated by an address signal of 9 bits is defined as 1 page. As seen from FIG. 9, the logical address comprises a page address and an offset address.

A conceptual structure of the TLB is shown in FIG. 10.

The TLB in accordance with the full associative method generally comprises a CAM section 71 for storing a logical page address and an SRAM section 72 for storing a physical page address. Each of the CAM section 71 and SRAM section 72 comprises the address storage locations of 32 entries, respectively. In operation, when a logical page address is applied to the CAM section 71, the location in which an address identical to the applied logical page address is stored, i.e. the word is detected. The detection of the match is performed by comparing the two logical page addresses, and is called "hit". The physical page address is generated from the SRAM section 72 corresponding to the hit word. If a certain word is hit in the CAM section 71, the translation from the logical page address into the physical page address therefor can be completed during 1 machine cycle.

On the other hand, if a match is not detected in the CAM section 71, i.e. a logical page address is not hit, the segment map table or page map table etc. is referred to, whereby the physical page address is obtained. The obtained physical page address is required to be registered in the CAM section 71 and SRAM section 72 for the processing thereafter. For the registration, it is necessary to delete the data of at least one word previously registered in the TLB, and to write new data in the word-deleted storage location. As a kind of algorithm to determine the word to be deleted or the storage location of the word to be deleted, the "Least Recently Used" algorithm (referred to as "LRU" hereinafter) is known. In order to implement the algorithm of LRU, it is further necessary to provide a counter for each word.

FIG. 11 is a conceptual diagram describing how data in the TLB is updated in accordance with the LRU algorithm. Referring to FIG. 11, a counter is provided for each entry or each word in the TLB 70, thus forming a counter section 73. If an applied logical page address hits a certain entry in the TLB 70, the counter of an entry having a counter value smaller than the counter value of the above mentioned entry is incremented. At the same timer the counter of the hit entry is reset. If an applied logical page address does not hit any entry in the TLB 70 (in case of mis-hitting), the data of the entry having the largest counter value is deleted, and new data is written therein. FIG. 11 shows the value of an entry having a counter value of 15 is deleted, and new data is written therein.

As mentioned above, in the CAM section 71 shown in FIG. 10 or 11, two pieces of data having a plurality of bits are compared. In the comparison, it is pointed out that the delays shown in FIGS. 18, 19A, and 19B take place, preventing high speed translation from the logical address into the physical address as a result.

SUMMARY OF THE INVENTION

One object of the present invention is to generate a comparison result in the shortest period of time in a data comparator comparing two pieces of data with a plurality of bits.

Another object of the present invention is to translate a logical address into a physical address faster in an address translator for a computer system.

Yet another object of the present invention is to translate a logical address into a physical address faster in a Translation Lookaside Buffer (TLB) for a computer system.

Briefly stated, a data comparator in accordance with the present invention includes first comparison circuitry for comparing the lower-order bits of the first data and the lower-order bits of the second data, and second circuitry for comparing the higher-order bits of the first data and higher-order bits of the second data. The second comparison circuitry includes match detecting circuitry for detecting a match between the higher-order bits of the second data and the higher-order bits of the first data. The data comparator further includes bypass circuitry which responds to the match detecting circuitry and bypasses the comparison result from the first comparison circuitry as the comparison result of the second comparison circuitry.

In operation, the match detecting circuitry detects a match between the higher data bits of the second data and the higher-order bits of the first data. When a match is detected, the bypass circuitry responds to the match detecting circuitry and bypasses the comparison result of the lower-order bits generated from the first comparison circuitry. Since the signal representative of the comparison result of the lower-order bits is not transmitted through the second comparison circuitry for comparing the higher-order bits, the comparison result of the lower-order bits can be obtained faster.

A data comparator in accordance with the present invention in one aspect compares first and second data each having a bit length of n bits. Each of the first and second data can be divided to the first of the higher data portion to the k-th of the lower-order data portion (n=m ·k). The data comparison circuitry includes first to k-th partial comparison circuitry each comparing the data portions corresponding to the first and second data. Each of the first to (k−1)-th partial comparison circuitry includes match detecting circuitry for detecting a match of the data portions corresponding to the first and second data, and bypass circuitry for bypassing the comparison result output from the lower-order partial comparison circuitry in response to the match detecting circuitry.

The foregoing and other objects, features, aspects and advantages of the present invention will become more apparent from the following detailed description of the present invention when taken in conjunction with the accompanying drawings.

Figure 7A:
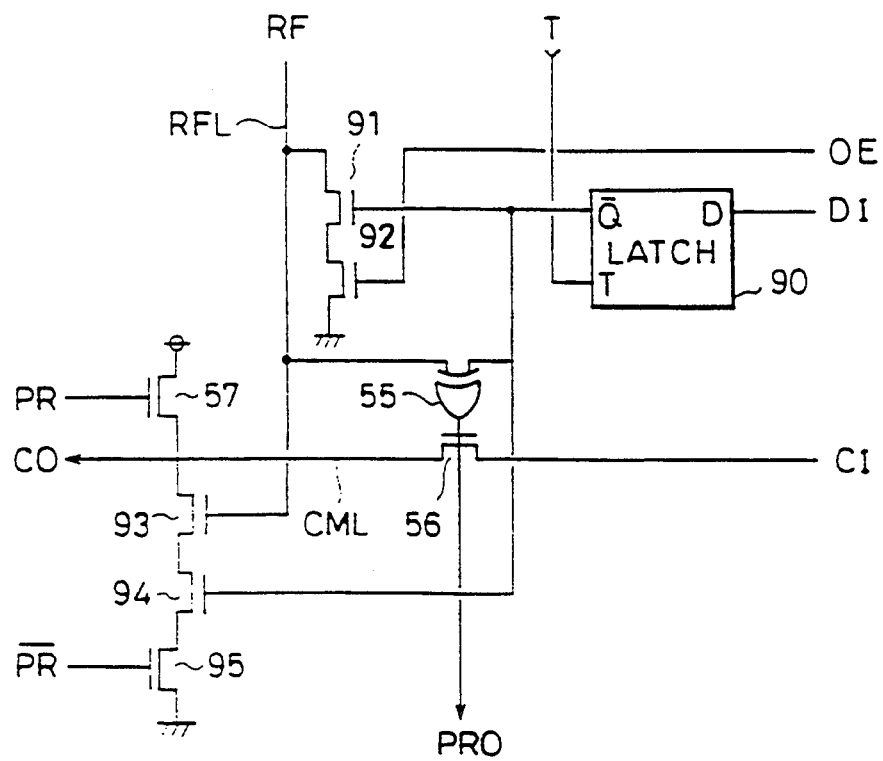
Figure 7B:
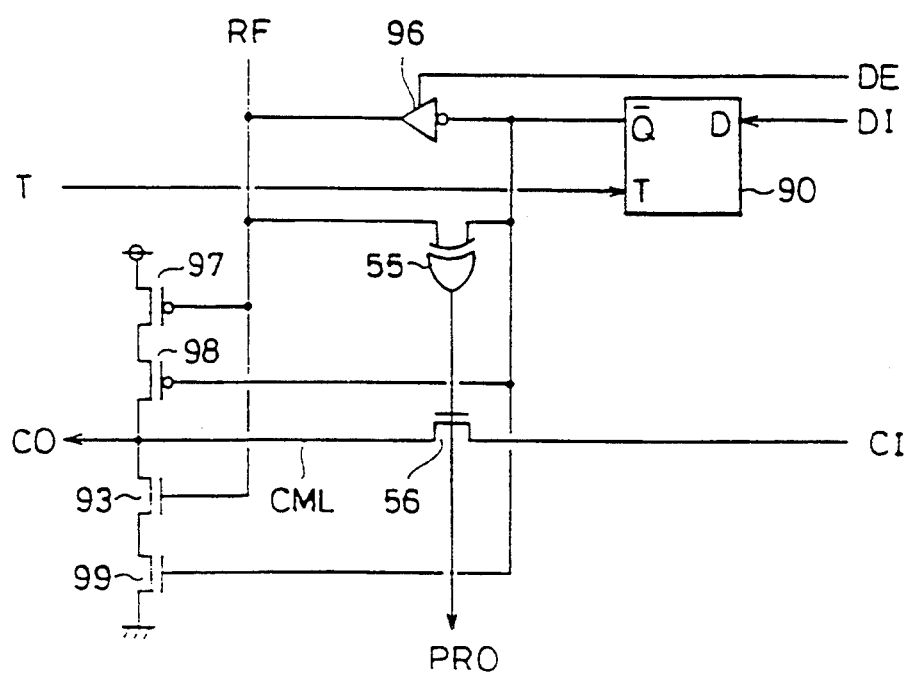
Figure 10:
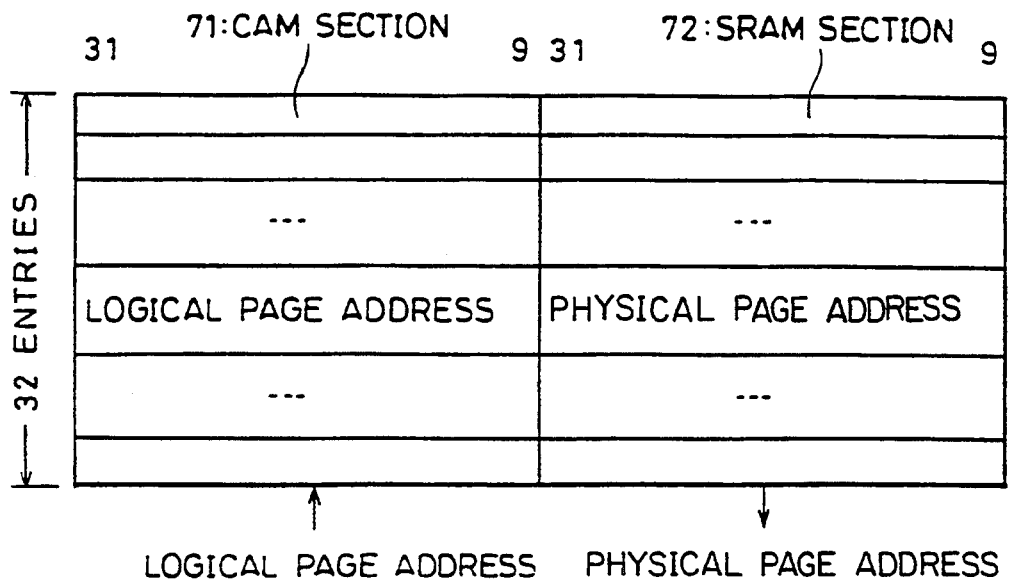

Each of FIGS. 6A to 6D and each of FIGS. 7A and 7B are circuitry diagrams representing other examples of the cell circuit shown in FIG. 10.

Figure 8:
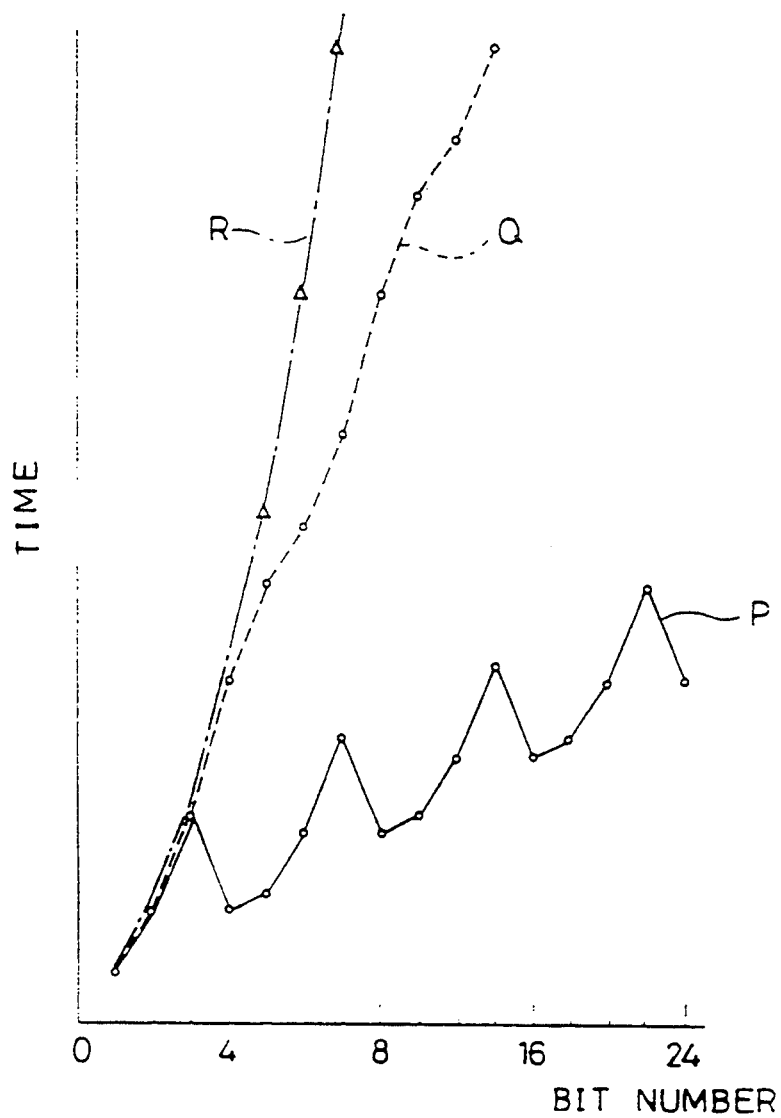

FIG. 8 is a graph representing time required for comparing two pieces of data.

Figure 9:

FIG. 9 is a format diagram indicating how a logical address is configured.

FIG. 10 is a conceptional diagram of the structure of a TLB.

Figure 11:
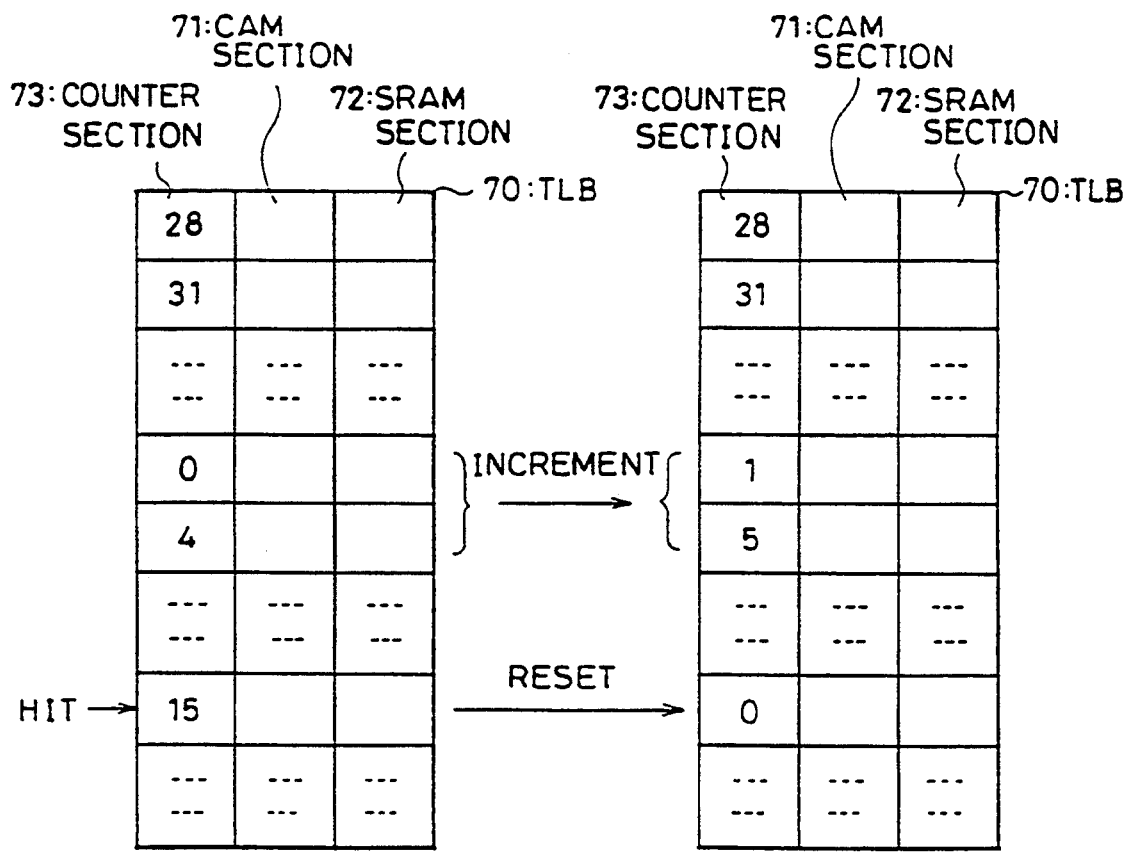

FIG. 11 is a conceptional diagram describing how data in a TLB is updated in accordance with the LRU algorithm.

Figure 12:
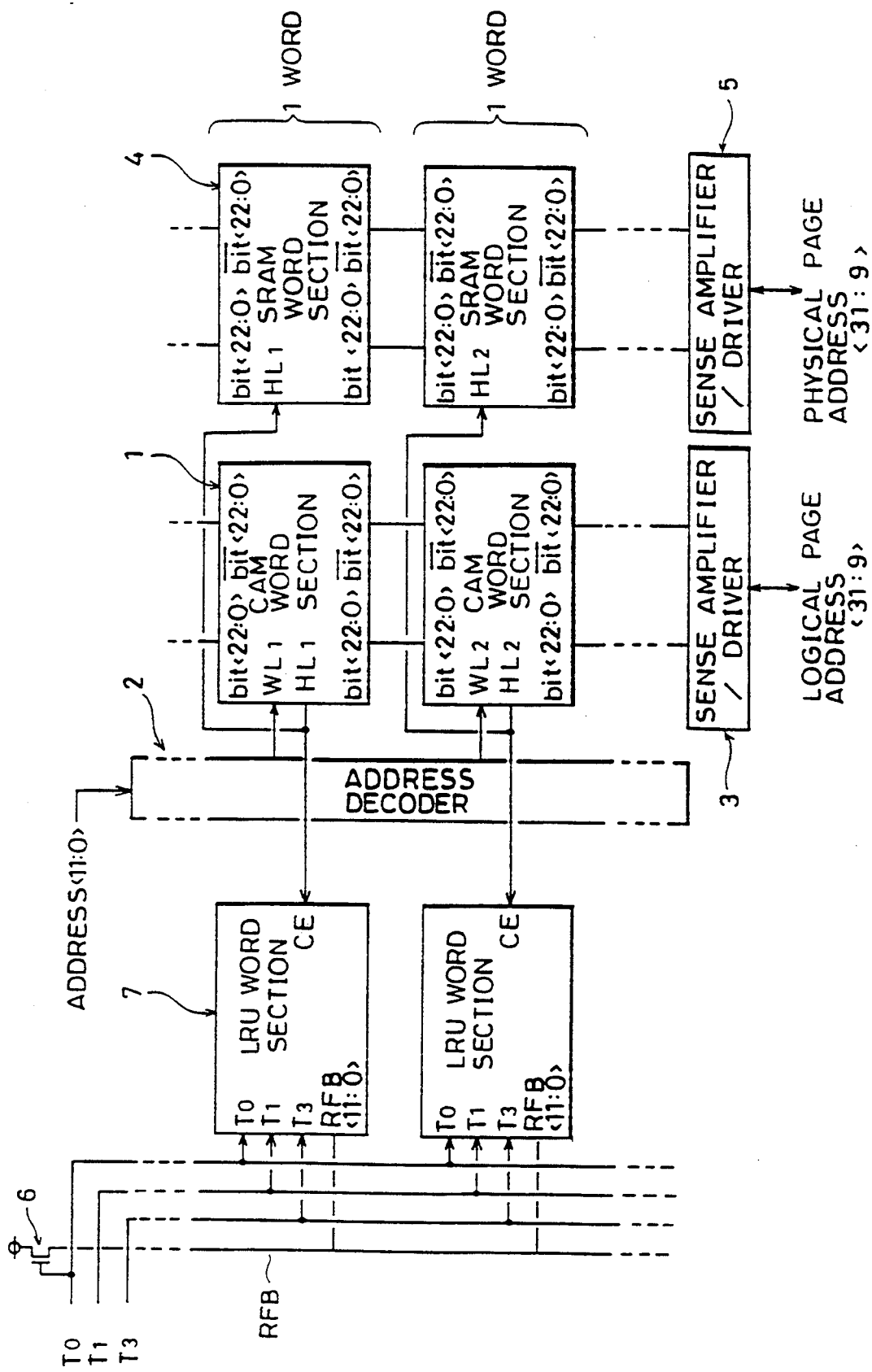

FIG. 12 is a block diagram of the entire TLB to which one embodiment of the present invention is applied.

Figure 13:
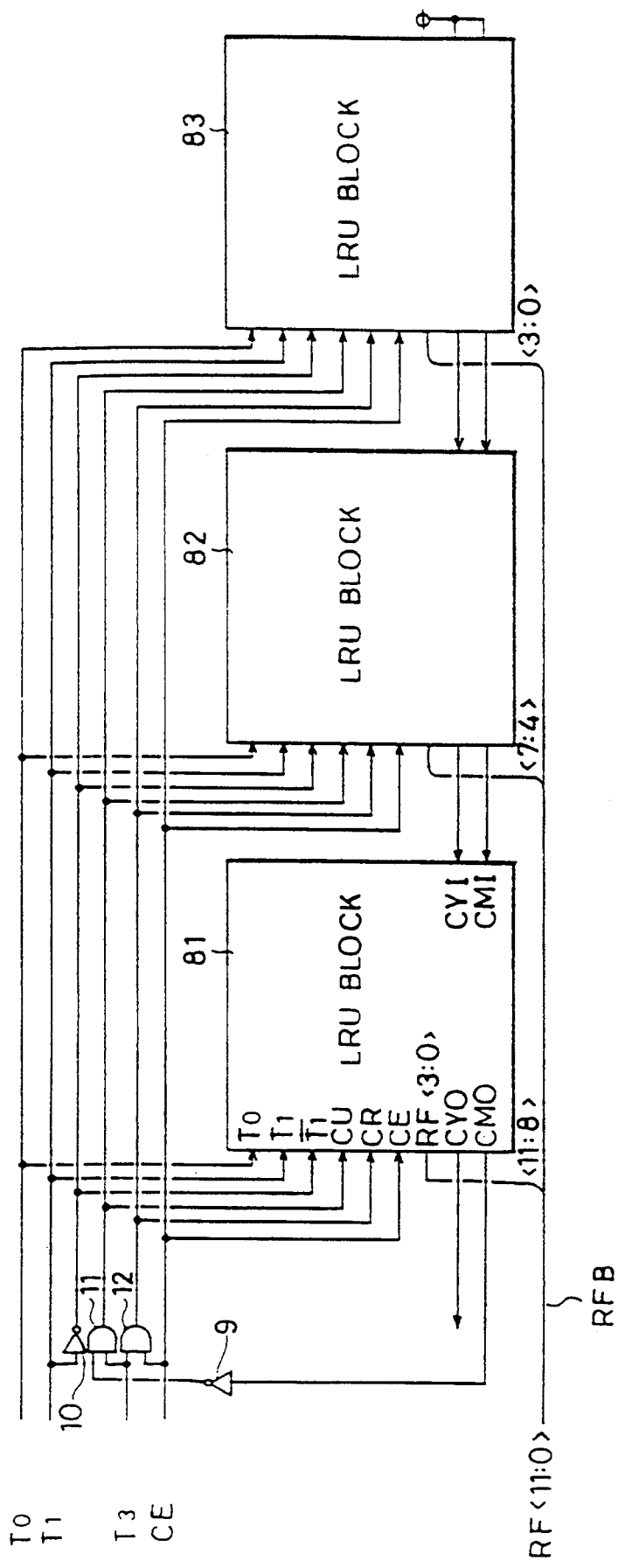

FIG. 13 is a block diagram showing the LRU word section shown in FIG. 12.

Figure 14:
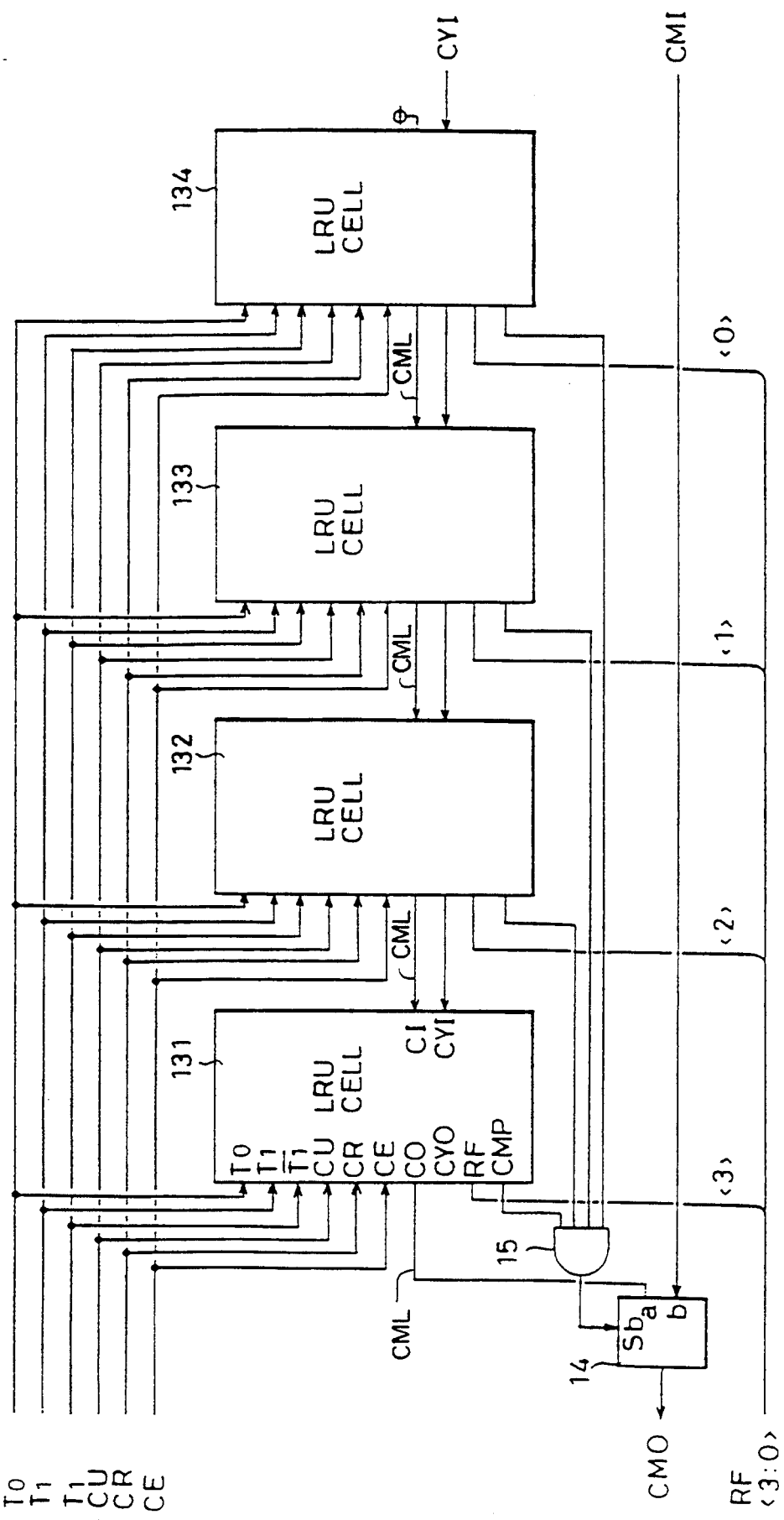

FIG. 14 is a circuit block diagram showing the LRU block shown in FIG. 13.

Figure 15:
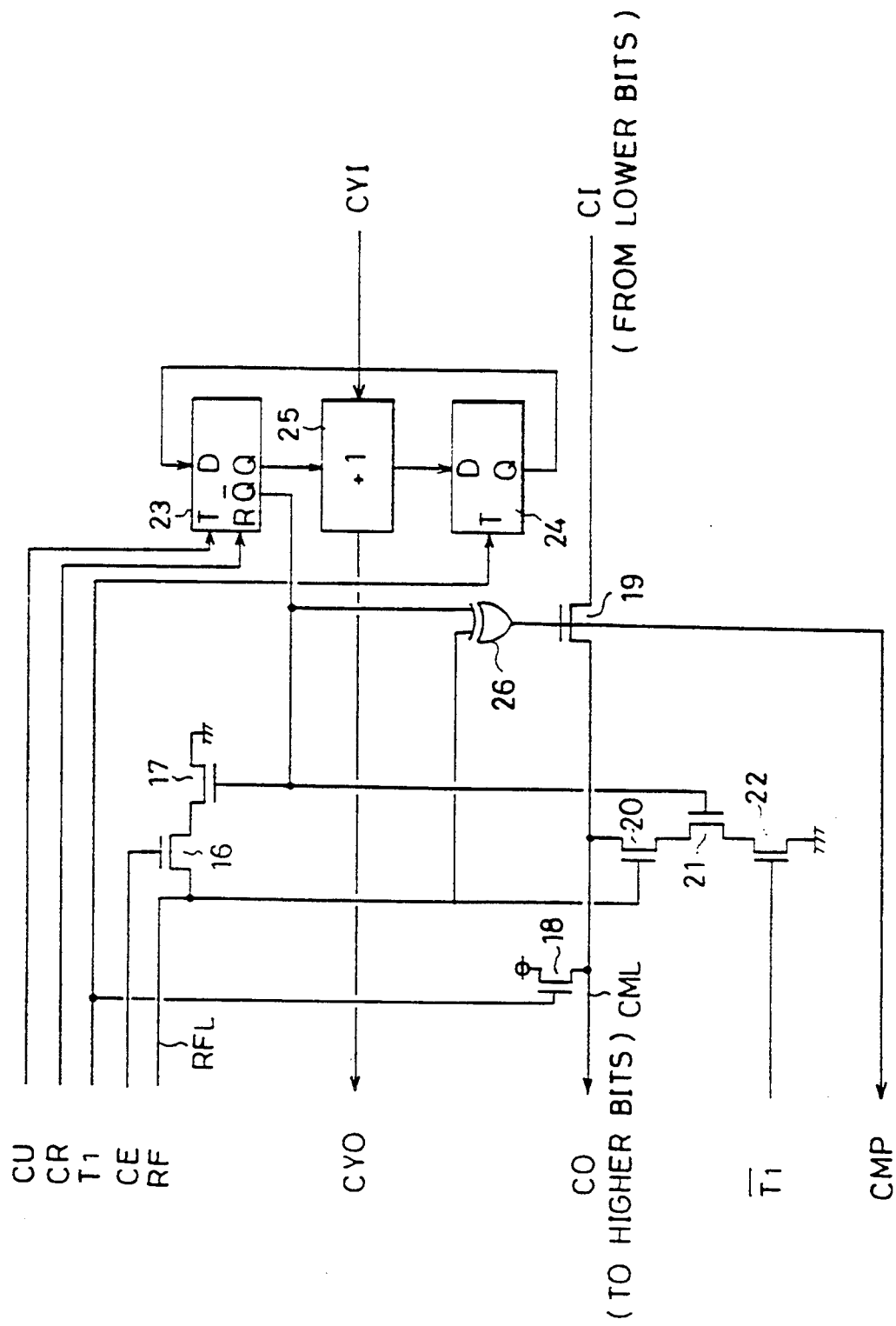

FIG. 15 ms a circuit diagram showing the LRU cell shown in FIG. 14.

Figure 16:
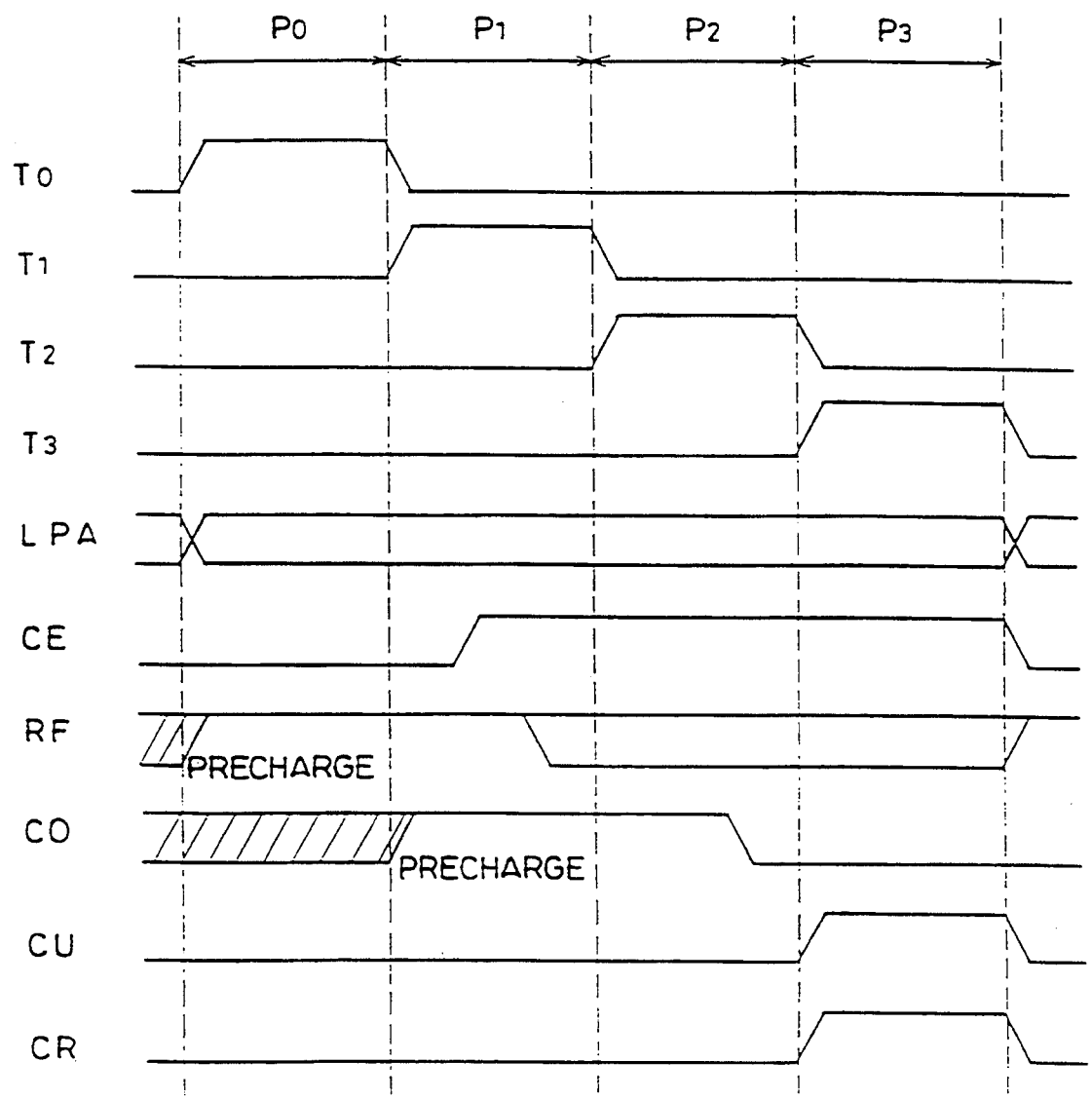

FIG. 16 is a timing diagram describing the operation of the circuit shown in FIG. 15.

Figure 17:
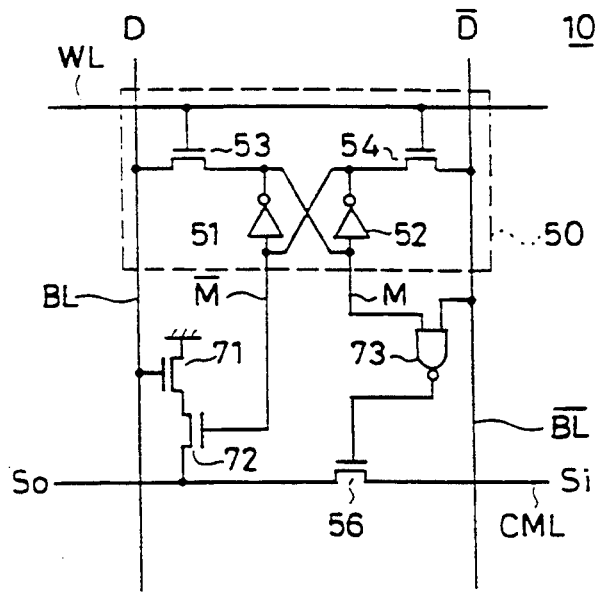

FIG. 17 is a circuit diagram of a conventional cell circuit for storing and comparing data of 1 bit.

Figure 18:
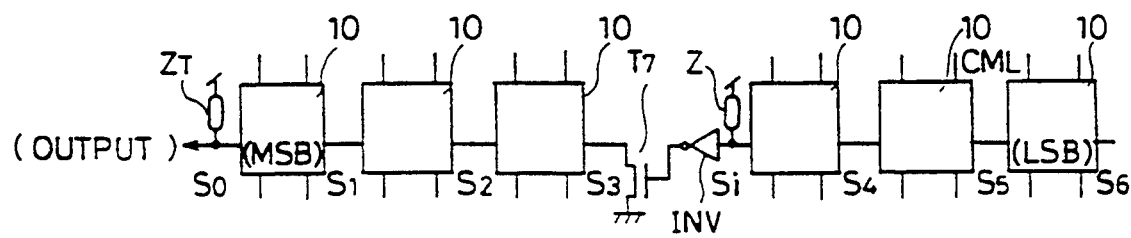

FIG. 18 is a conventional circuit diagram in which a cell circuit is cascaded through an inverter.

Figure 19A:
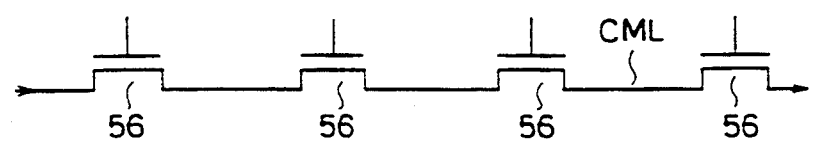

FIG. 19A is a circuit diagram describing the delay of a signal in the circuit shown in FIG. 18.

Figure 19B:
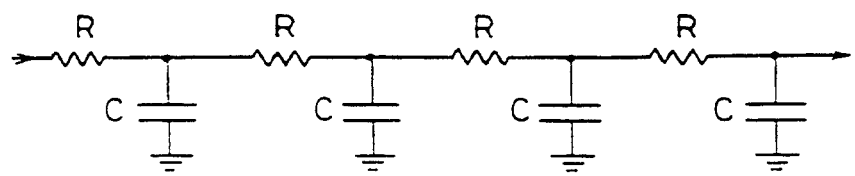

FIG. 19B is an equivalent circuit diagram of the circuit shown in FIG. 19A.

DESCRIPTION OF THE PREFERRED EMBODIMENTS

Figure 1:
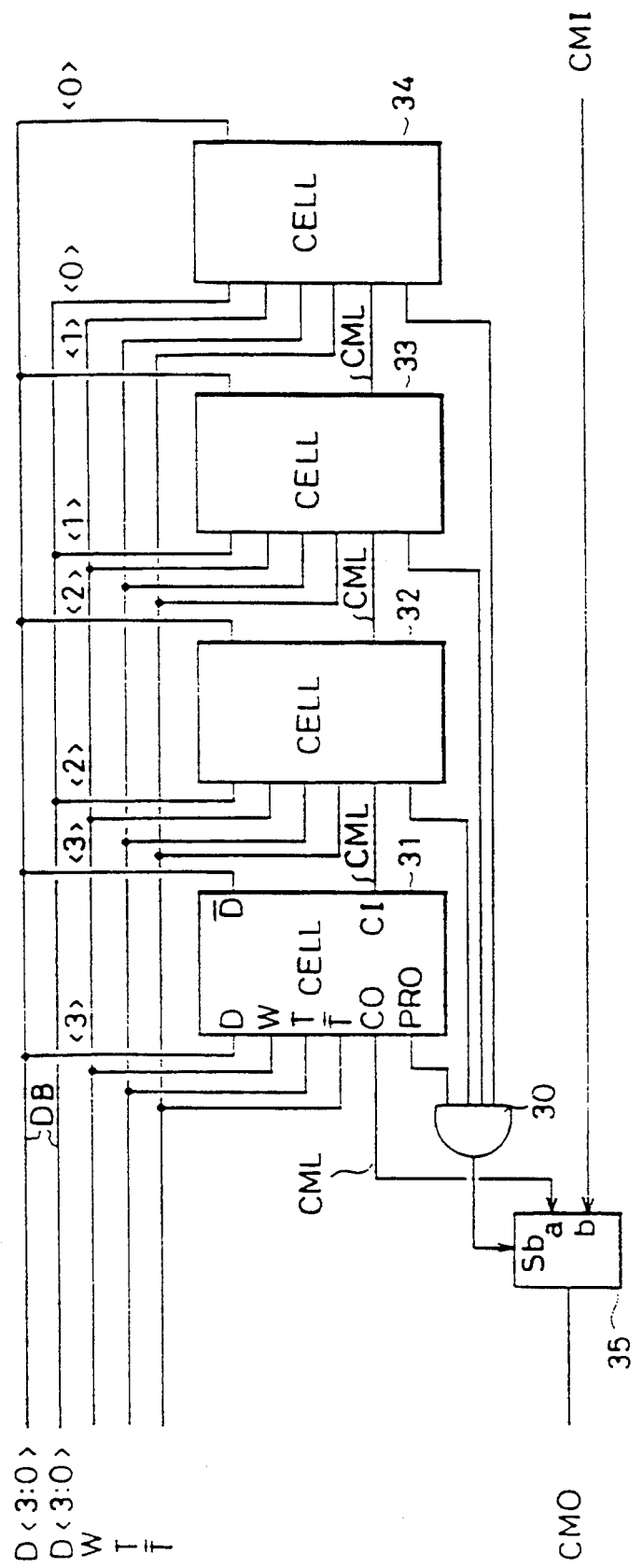
FIG. 1 is a circuit block diagram of a data comparator circuit representing one embodiment in accordance with the present invention.

Referring to FIG. 1, a data comparison circuit compares applied data of 4 bits and previously stored data of 4 bits. The data comparison circuit includes 4 cell circuits 31 to 34 connected in series through a comparison line CML. Each of the cell circuits 31 to 34 is connected to receive externally applied data signals D, $\overline{D}$ of 1 bit. Furthermore, each of the cell circuits 31 to 34 is controlled by a word selecting signal w and clock signals T, $\overline{T}$. The data bits of the data to be compared are stored in each of the cell circuits 31 to 34 in advance. The data bits of other data D, $\overline{D}$ to be compared through data buses DB are applied to each of the cell circuits 31 to 34, respectively. For instance, the cell circuit 31 compares the data bit of the applied data with the data bit of the stored data. When a match is found between the two data bits, the cell circuit 31 generates a high level propagation signal PRO. The propagation signal PRO generated from each of the cell circuits 31 to 34 is applied to an AND gate 30. On the other hand, if a match is not found between the two data signals, a signal CO representative of the result of the comparison is generated. The signal CO generate from each of the cell circuit 31 to 34 is applied to the higher cell circuits through the comparison line CML. A selector 35 has one input a connected to receive the signal CO from the cell circuit 31, and another input b connected to receive a signal CMI representative of the comparison result of the lower-order data bits.

If a match is detected between 4 data bits by the cell circuits 31 to 34 shown in FIG. 1, the AND gate 30 applies a high level signal to the selector 35. The selector 35 thus generates the signal CMI representing the result of the comparison of the lower-order bits as a signal CMO. On the other hand, if at least one among 4 data bits does not match, the AND gate 30 applies a low level signal to the selector 35. The selector 35 generates the signal on the comparison line CML as the signal CMO.

Figure 2:
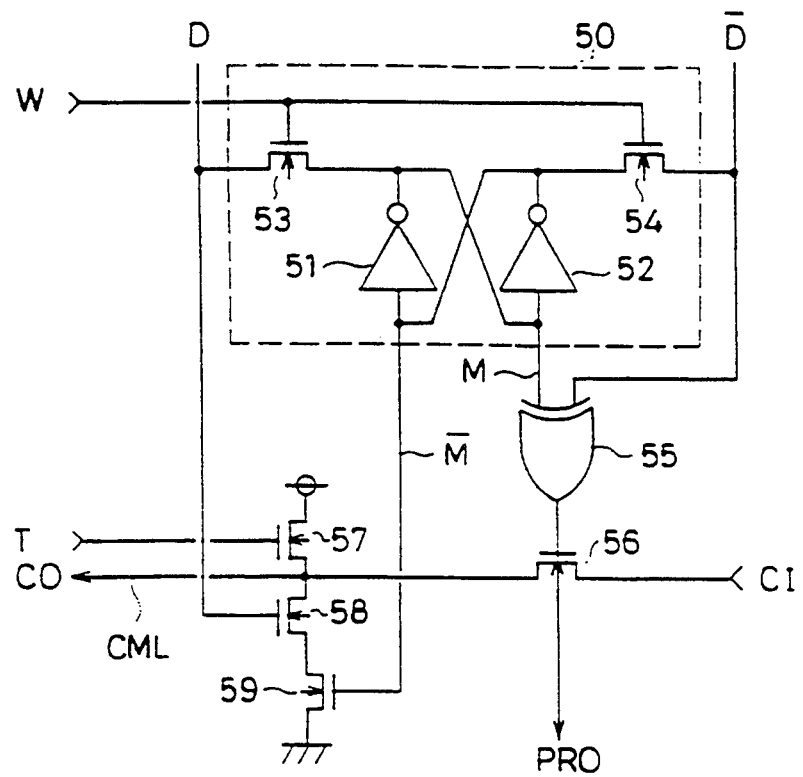
FIG. 2 is a circuit diagram representing one example of a cell circuit shown in FIG. 1.

FIG. 2 shows one example of one cell circuit shown in FIG. 1. Referring to FIG. 2, the cell circuit includes an SRAM section 50 for storing data bits, and an EXOR gate 55 for detecting a match between two data bits, an NMOS transistor 56 for transmitting comparison results, an NMOS transistor 57 for precharging the comparison line CML, and NMOS transistor 58, 59 for controlling the potential of the comparison line CML in response to the result of comparison between the two data bits. The SRAM section 50 includes cross-coupled inverters 51, 52 and NMOS transistors 53, 54.

In operation, the SRAM section 50 responds to a high level word selecting signal W, and stores the data of 1 bit define by the data signals $D$, $\overline{D}$. If a match is round between the applied data bit $\overline{D}$ and the stored data bit M, the EXOR gate 55 generates a high level propagation signal PRO. The transistor 55 is turned on in response to the signal PRO, a signal CI representing the comparison result of the lower-order bits is transmitted through the transistor 56 as a signal CO. If a match is not found between the two data bits, the transistor 56 is turned off. In this case, since the transistors 58 and 59 are turned on or off depending upon the result of comparison between the two data bits, the potential of the comparison line CML is changed in response to the comparison result.

Figure 3:
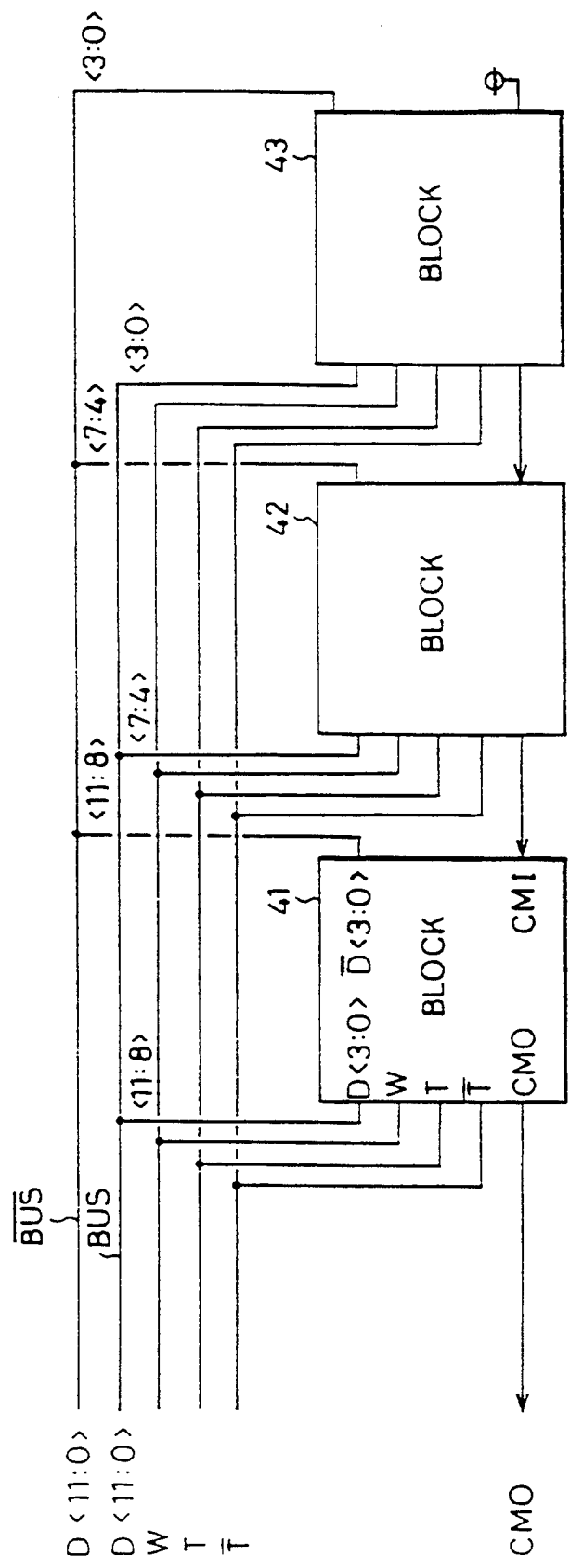
FIG. 3 is a circuit block diagram of a word comparison circuit utilizing the data comparison circuit shown in FIG. 1.

FIG. 3 shows a word comparison circuit making use of a data comparison circuit. Referring to FIG. 3, the word comparison circuit includes 3 blocks 41 to 43 each provided with a data comparison circuit as shown in FIG. 1. Each block 41 to 43 is connected to receive data signals $D$, $\overline{D}$ of 4 bits through a bus line BUS. Additionally, each of the blocks 41 to 43 is controlled by a word selecting signal W and clock signals T, $\overline{T}$. A signal CMO representing comparison results in the respective blocks 41 to 43 is applied to the higher block.

Figure 4:
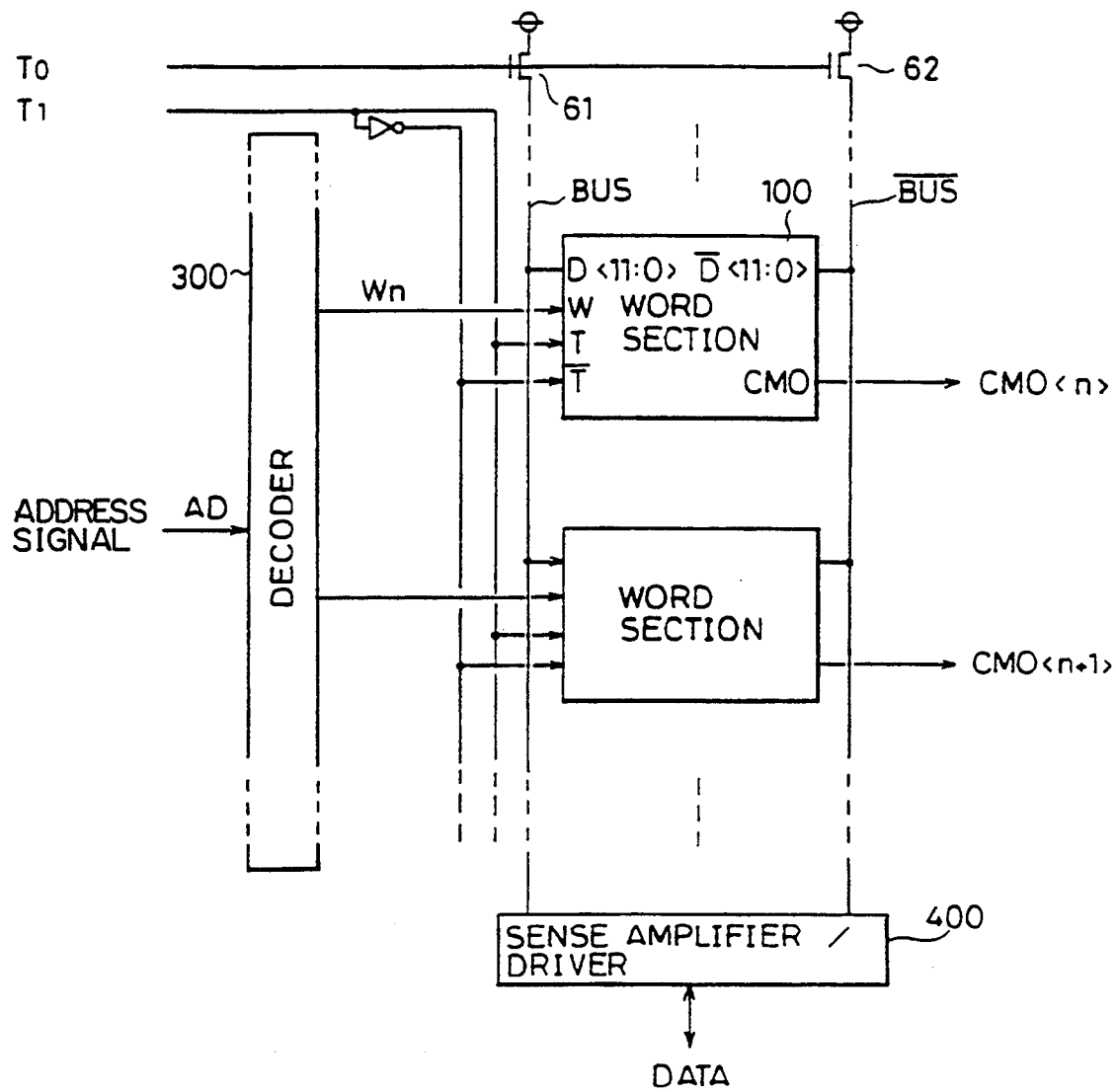
FIG. 4 is a circuit block diagram of the entire comparator utilizing the word comparison circuit shown in FIG. 3.
Figure 6A:
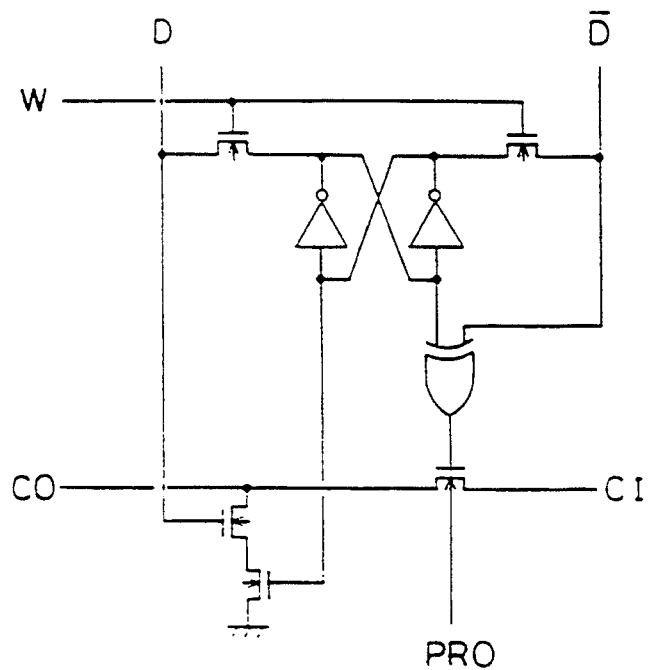
Figure 6B:
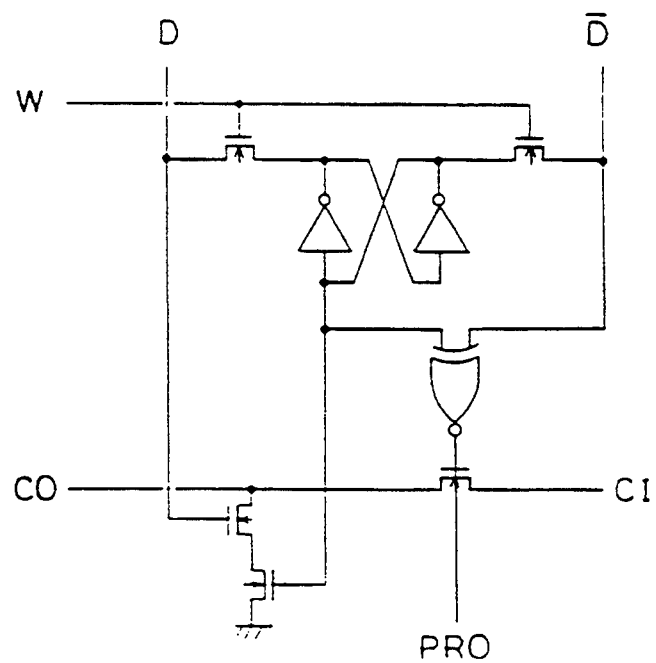
Figure 6C:
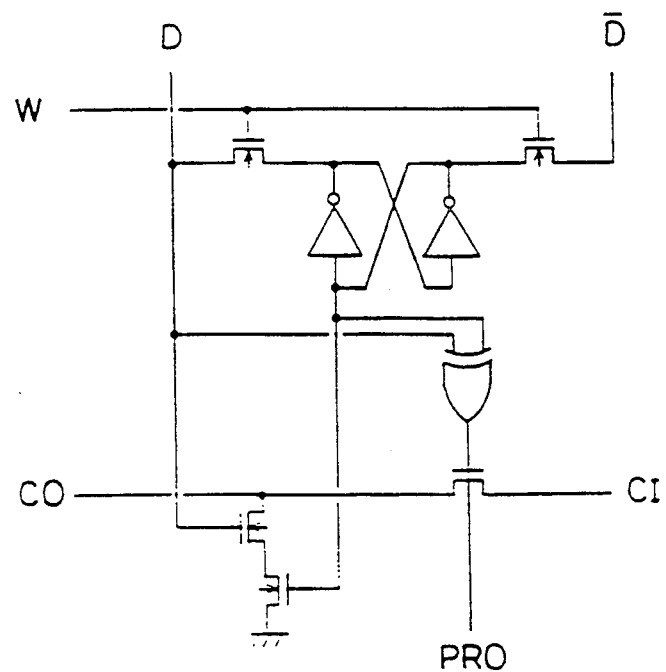
Figure 6D:
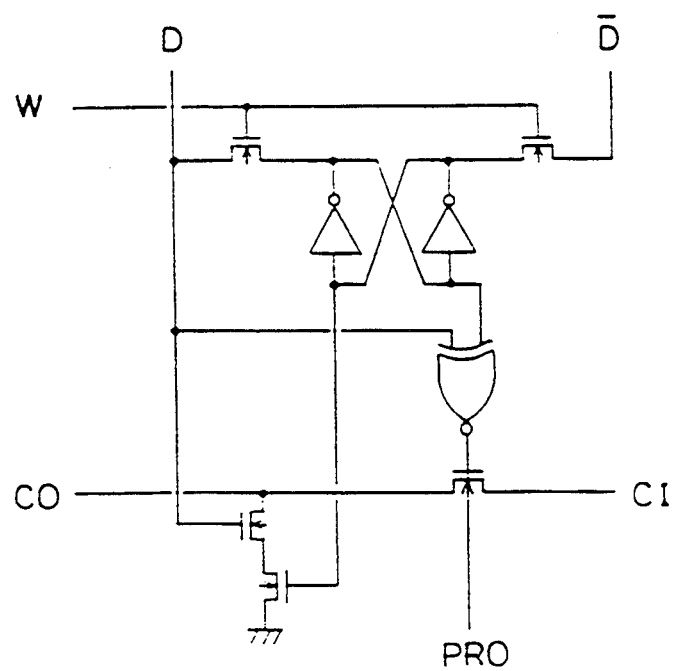

FIG. 4 describes the entire comparator in which the word comparison circuit shown in FIG. 3 is utilized. Referring to FIG. 4, the comparator includes a large number of word sections 100 provided with the word comparison circuit shown in FIG. 3. The word section 100 receives data signals $D$, $\overline{D}$ of 12 bits through the bus lines BUS, $\overline{BUS}$. In order to precharge each of the data buses BUS, $\overline{BUS}$, NMOS transistors 61 and 62 are provided, respectively. Each of the bus lines BUS, $\overline{BUS}$ is supplied with data signals of 12 bits amplified by a sense amplifier/driver circuit 400. A decoder 300 responds to an address signal AD and generates a word selecting signal $W_n$ to select the word section 100. The word section 100 selected by the word selecting signal $W_n$ generates a signal CMO$<n>$ representing the comparison result.

Figure 5:
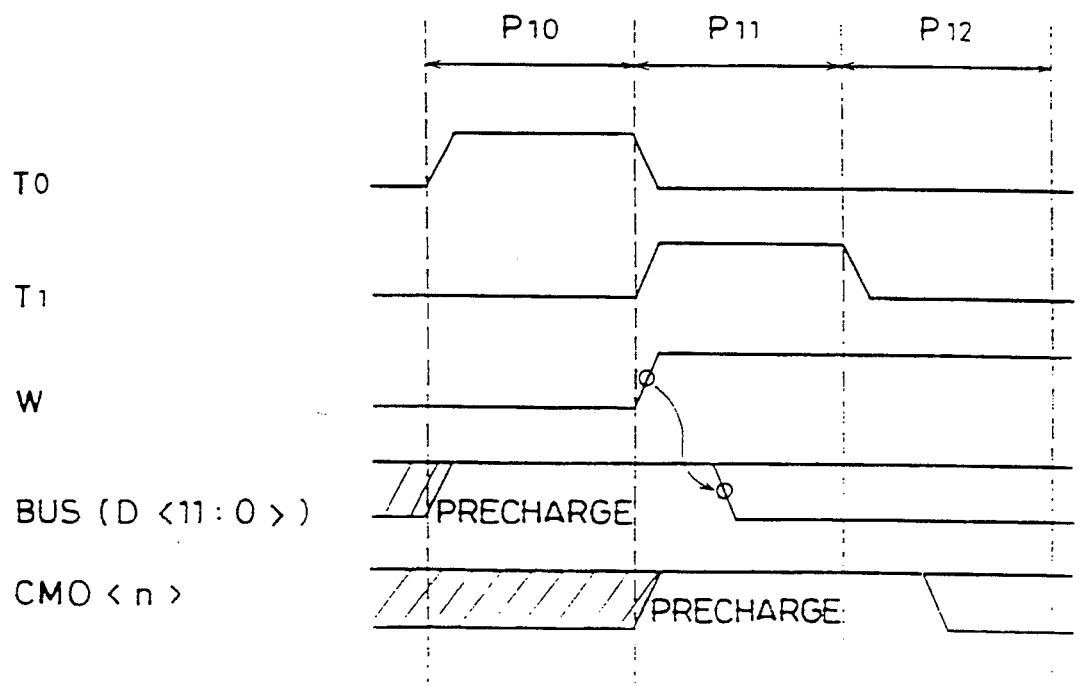
FIG. 5 is a timing diagram to describe the operation of the circuits shown in FIGS. 1 to 4.

Referring to FIG. 5, a high level signal TO is applied to the transistors 61 and 62 during a period 10, thereby precharging the bus lines BUS, $\overline{BUS}$. A clock signal T1 and a word selecting signal W rise in a period P11. In the word section 100 selected by the word selecting signal W, each of the previously stored 12 bit data signals $D<11: 0>$, $\overline{D}<11: 0>$ are loaded onto the bus lines BUS, $\overline{BUS}$. On the other hand, the comparison line CML shown in FIG. 2 is precharged in response to the clock signal T1 (i.e. T). After the precharge is completed, the comparison operation is initiated in each of the cell circuits during a period P12. This results in generation of the signal CMO$<n>$ representing the result of the comparison.

As mentioned above, in the data comparison circuit shown in FIG. 1, when a match is found between two data, a delay circuit as shown in FIG. 19B is not constructed since a signal representing the comparison result of the lower-order bits is transmitted to the blocks for the higher-order bits not through the cell circuits 31 to 34 but through the line CMI. A signal indicating the result of comparison between the two pieces of data is accordingly obtained faster.

Each of FIGS. 6A to 6D shows an example of the cell circuit applicable to the data comparison circuit shown in FIG. 1. Each of these cell circuits may be applied in place of the cell circuit shown in FIG. 2 and operates in the same manner.

Each of FIGS. 7A to 7B also shows an example of a cell circuit applicable to the data comparison circuit shown in FIG. 1. In FIGS. 7A to 7B, data to be compared are stored in a latch circuit 90. Referring to FIG. 7A, the latch circuit 90 responds to the clock signal T and latches data DI. When an output enable signal OE rises, the data latched in the latch circuit 90 is applied to a reference line RFL. On the other hand, the comparison line CML is already precharged in response to a precharging signal PR. Since transistors 93 and 94 start operating in response to the result of comparison between 2 data bits, a signal CO representing the result of the comparison is thus generated. On the other hand, it is pointed out that it is not necessary for the cell circuit shown in FIG. 7B to precharge the comparison line CML unlike the circuit shown in FIG. 7A.

FIG. 8 shows time required for comparing two pieces of data. Referring to FIG. 8, the ordinate represents the time required, and the abscissa represents the bit number of the data to De compared. A curve P represents for example the case of the circuit shown in FIG. 1, i.e. to which the present invention is applied. A curve Q shows the case of the circuit shown in FIG. 18, i.e. how the inverter INV ant the transistor $T_7$ are applied. A curve R simply shows the case in which the cell circuits are connected in series. As can be seen from FIG. 8, it is pointed out that if the present invention is applied for comparing data having a bit number of more than 4, the time required for the comparison is significantly reduced compared to a conventional circuit.

One example of the TLB to which the present invention is applied is shown in FIG. 12. Referring to FIG. 12, the TLB includes a CAM word section 1 for storing a logical page address, an SRAM word section 4 for storing a physical page address, an LRU word section 7 for counting counter values for each word, an address decoder 2 for designating each word, a sense amplifier/driver 3 for writing and reading a logical page address with respect to the CAM word section 1, and a sense amplifier/driver 5 for writing and reading a physical page address with respect to the SRAM word section 4.

FIG. 13 is a block diagram showing the LRU word section 7 shown in FIG. 12. Referring to FIG. 13, the LRU word section includes 3 LRU blocks 81 to 83, e.g., partial math detecting means, for processing portion of a count value each being of 4 bits. Each of the LRU blocks 81 to 83 operates in response to clock signals T0, T1 and T3. The inverter 10 receives the clock signal T1 and applies the inverted clock signal T1 to each of the LRU blocks 81 to 83. An AND gate 12 receives the clock signal T3 and a counter output enable signal CE and applies a counter resetting signal CR to each of the blocks 81 to 83. The LRU block 81 processes a portion of the count value of higher 4 bits, the LRU block 82 processes the intermediate 4 bits, and the LRU block 83 processes the lower-order 4 bits. A signal CMO representative of the result of comparison is generated from the block 83 toward the block 81 through the block 82. The AND gate 11 receives the clock signal T3 and the signal CMO which has been inverted by an inverter 9, and generates a counter-up signal CU. Each of the LRU blocks 81 to 83 is connected to receive reference data RF such as preselected count value, each being of 4 bits through a bus RFB for referring to data. Each of the LRU blocks 81 to 83 generates a carry output signal CYO.

FIG. 14 shows the LRU block 81 shown in FIG. 13. Referring to FIG. 14, the LRU block includes 4 LRU cells 131 to 134 each for comparing each bit of the count values, an AND gate 15 for receiving a signal on comparison line CML indicative of the result comparison from each of the cells 131 to 134, and a selector 14 responsive to the output signal, e.g., partial match signal, of the AND gate 15 for operating. When the AND gate 15 generates a low level signal, the selector 14 generates a signal applied to the input terminal a as a comparison result signal CMO. On the contrary, when the AND 15 generates a high level signal, the selector 14 generates a signal applied to the input terminal b, i.e., a signal CMI indicative or the result of comparison of the lower-order bits, e.g., a lower partial match signal, as a signal CMO. That is, when the comparison result is determined by each of the LRU cells 131 to 134, the selector 14, which functions as, for example, bypass means, generates a comparison result signal CO generated from the LRU cell 131, as a signal CMO. On the contrary, when the result of the comparison is not determined by each of the LRU cells 131 to 134, the selector 14 generates the comparison result of the lower-order bits as a signal CMO. Each of the LRU cells 131 to 134 is connected to receive 1 bit respectively among the reference data RF to be compared.

FIG. 15 shows the LRU cell 131 shown in FIG. 14. Referring to FIG. 15, the LRU cell includes a latch circuit 23 for receiving a counter-up signal CU and a counter reset signal CR, a latch circuit 24 for receiving a clock signal TI, an incrementer 25 for receiving a carry input signal CYI and generating a carry output signal CYO, an EXOR gate 26, an NMOS transistor 19 for transmitting signals, and an NMOS transistor 18 for precharging the comparison line CML.

Referring to FIGS. 12 to 16, the operation will be described in the following. Each of the LRU cells stores/updates a counter value in accordance with the LRU algorithm, and compares a counter value in the hit entry with the count value included therein. One machine cycle includes 4 periods P0 to P3 as shown in FIG. 16. Clock signals T0 to T3 with waveforms shown in FIG. 16 are applied. A one bit counter is constituted by the latch circuits 23 and 24, and the incrementer 25. The counter responds to a count-up signal CU and counts up, and is reset in response to a counter-resetting signal CR. The carry input signal CYI indicates the requirement of carry from the lower-order bits. The carry output signal CYO indicates the requirement of carry to the higher-order bits.

A reference line RFL is precharged in advance. The reference line RFL is driven by transistors 16 and 17. That is, if a high level counter output enable signal CE is applied, the potential of the reference line RFL changes in response to the signal which has been latched in the latch circuit 23. The EXOR gate 26 generates a comparison transmission signal CMP. The comparison line CML is precharged in the period P1 and subsequently operates in accordance with the following Table 1.

TABLE 1

| Latch 23 | RF | CMO |
|---|---|---|
| 0 | 0 | CMI |
| 1 | 1 | CMI |
| 0 | 1 | 0 |
| 1 | 0 | 1 |

Referring to FIG. 16, when a logical page address is applied to the TLB and is hit in a certain CAM word section 1, a hit signal HL1 is generated. An LRU word section 7 receives the hit signal HL1 as a comparison output enable signal CE. With the reference line RFL already precharged in the period P0, when a signal CE rises in the period P1, the value of the hit word in the latch circuit 23 is applied to the reference line RFL. On the other hand, the comparison lines CML of each of the LRU cells 131 to 134 being precharged in the period P1, in the period P2 comparison is conducted between the signal on the reference line RFL and the signal latched in the latch circuit 23 thereof. In response to the result of the comparison, a counter-up signal CU and a counter resetting signal CR are generated in the period P3, the necessary counting up and resetting of the value of the counter is performed.

As mentioned above, by applying the present invention in the TLB as indicated in FIG. 14, the similar effect as described in the embodiment shown in FIG. 1 is obtained. That is, in the circuit shown in FIG. 14, since the signal CMI which indicates the comparison result of the lower-order bits does not pass the LRU cells 131 to 134, the result of the comparison between two count values can be obtained faster.

As described in the foregoing, in the data comparison circuit shown in FIG. 1, four cell circuits 31 to 34 compare 4 bits corresponding to two data with 12 bits. In this comparison, if a match is detected, a selector 35 generates a signal CMO, equal to CMI representing the result of comparison of the lower-order bits, in response to a high level signal generated from the AND gate 30. The signal CMI is not transmitted toward the higher-order bits through the cell circuits 31 to 34 and, therefore, a delay circuit as shown in FIG. 19B is not constituted. As a result, it is possible to obtain the comparison result of the two data in a shorter period of time. Additionally, the application of the present invention as described in FIG. 14 to the TLB shown in FIG. 12, the similar effect to the circuit shown in FIG. 1 is obtained. That is, a logical address can be translated into a physical address at a higher speed. In other words, a TLB which operates faster is provided.

Although the present invention has been described and illustrated in detail, it is clearly understood that the same is by way or illustration and example only and is not to be taken by way of limitation, the spirit and scope of the present invention being limited only by the terms of the appended claims.

What is claimed is:

1. An address translator for translating an externally applied first logical address into a physical address, comprising;
    a) physical address storage means for storing the physical address;
    b) logical address storage means for storing a second logical address corresponding to the physical address stored in said physical address storage means, said logical address storage means generating a logical address detection signal when said first and second logical addresses match one another and causing said physical address storage means to output the physical address corresponding to the externally applied first logical address; and
    c) a plurality of LRU circuits each having an input/output port and each storing a count value for each entry of the externally applied first logical address matching said second logical address, and in response to the logical address detection signal, one of said plurality of LRU circuits providing the count value stored therein to said input/output port of the other LRU circuits and each of the other LRU circuits comparing the count value stored therein with the count value provided by said one of said plurality of LRU circuits, wherein each LRU circuit includes:
        i) a plurality of partial match detecting means each for comparing a corresponding portion of the count value provided by said one of said LRU circuits to provide a partial match signal, and
        ii) bypass means connected to two adjacent partial match detecting means and responsive to the partial match signal of a higher partial match detecting means for bypassing a lower partial match signal of the corresponding portion of the count value of the lower partial match detecting means to a next higher partial matching detecting means.

2. The address translator according to claim 1 comprising a Translation Lookaside Buffer (TLB).

* * * * *